(12) United States Patent
Ibe

(10) Patent No.: US 9,105,421 B2
(45) Date of Patent: Aug. 11, 2015

(54) INPUT DEVICE AND METHOD FOR DETECTING SWITCH OF INPUT DEVICE

(75) Inventor: Takafumi Ibe, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 831 days.

(21) Appl. No.: 13/286,291

(22) Filed: Nov. 1, 2011

(65) Prior Publication Data

US 2012/0112558 A1 May 10, 2012

(30) Foreign Application Priority Data

Nov. 9, 2010 (JP) .................................. 2010-250445

(51) Int. Cl.
H01H 33/59 (2006.01)
H01H 13/70 (2006.01)
H03M 11/24 (2006.01)

(52) U.S. Cl.
CPC .............. *H01H 13/70* (2013.01); *H03M 11/24* (2013.01); *H01H 2231/026* (2013.01); *H01H 2239/012* (2013.01); *H01H 2239/03* (2013.01); *Y10T 307/747* (2015.04)

(58) Field of Classification Search
CPC ....................................................... H01H 33/59
USPC ......................................................... 307/113
See application file for complete search history.

(56) References Cited

U.S. PATENT DOCUMENTS

| 5,182,465 | A * | 1/1993 | Stanley ......................... 307/115 |
| 7,023,258 | B2 * | 4/2006 | Hamase ......................... 327/308 |
| 2004/0051623 | A1 * | 3/2004 | Ono ............................... 338/320 |
| 2008/0303541 | A1 * | 12/2008 | Miller ............................ 324/754 |

FOREIGN PATENT DOCUMENTS

| JP | 58-221742 | 12/1983 |
| JP | 58221742 A | * 12/1983 |
| JP | 2009-032536 | 2/2009 |

* cited by examiner

*Primary Examiner* — Rexford Barnie
*Assistant Examiner* — Joseph Inge
(74) *Attorney, Agent, or Firm* — Panasonic Patent Center

(57) ABSTRACT

An input device includes a resistor group, an input terminal, a plurality of switches, and a control unit. The resistor group includes a plurality of resistors connected in series. The input terminal is connected to one end of the resistor group. Each switch of the plurality of switches has one end connected to each resistor of the plurality of resistors at an opposite side viewed from the input terminal and the other end grounded. The control unit detects an applied voltage to the input terminal when the plurality of switches are all turned off. Furthermore, the control unit detects an output voltage from the input terminal when any of the plurality of switches is turned on, and detects a switch that is turned on among the plurality of switches based on a voltage ratio of the output voltage to the applied voltage.

2 Claims, 4 Drawing Sheets

INPUT DEVICE AND METHOD FOR DETECTING SWITCH OF INPUT DEVICE

BACKGROUND OF THE INVENTION

1. Field of the Invention

The present invention relates to an input device for various electronic equipment and a method for detecting a switch of the input device.

2. Background Art

Recently, automobiles equipped with an input device such as a steering switch in the vicinity of a steering wheel have been developed. A user can operate electronic equipment such as an audio system and an air conditioner by operating the input device by the finger in a state in which the user holds the steering wheel. In such automobiles, an input device capable of reliable operation without an operation error has been demanded.

FIG. 3 is a circuit block diagram of a conventional input device. FIG. 4 is a front view of a steering wheel using the conventional input device.

A plurality of resistors 1, 2, and 3 such as a fixed resistor are mounted on a wiring board (not shown), and connected in series. A plurality of wiring patterns are formed on the upper and lower surfaces of the wiring board. Furthermore, switches 4, 5, and 6 such as a push switch are mounted on the wiring board. One end of switch 4 is connected between resistor 1 and resistor 2, one end of switch 5 is connected between resistor 2 and resistor 3, and one end of switch 6 is connected to resistor 3, respectively, by the wiring pattern. The other ends of switches 4, 5, and 6 are grounded. Thus, a resistor divider is formed.

Control unit 7 such as micro computer is mounted on the wiring board. Resistor 1 and control unit 7 are connected to input terminal 8 such as a connector by the wiring pattern. Control unit 7 is connected to output terminal 9 such as a connector by the wiring pattern.

To the other input terminal 8A provided on the wiring board, resistors 1A, 2A, and 3A are connected in series. Switches 4A, 5A, and 6A are respectively connected to resistors 1A, 2A, and 3A to form a resistor divider. Control unit 7 is connected to input terminal 8A.

Input device 10 configured above is attached to right and left spokes 20B between steering wheel 20 and center pad 20A as shown in FIG. 4 and installed in an automobile. An air bag or the like is housed in pad 20A. A plurality of push buttons 31 to 33 and push buttons 41 to 43 each showing a different function are attached to switches 4 to 6 and switches 4A to 6A, respectively.

Furthermore, as shown in FIG. 3, input terminal 8 of input device 10 is electrically coupled to drive unit 24 of electronic equipment 22 such as an audio system via diode 25. Diode 25 is connected in series to resistor 23. Drive unit 24 is, for example, micro computer coupled to a power supply such as a battery via resistor 23.

Furthermore, input terminal 8A is electrically coupled to drive unit 24A of electronic equipment 22A such as an air conditioner via diode 25A. Drive unit 24A is coupled to a power supply via resistor 23A. Output terminal 9 is electrically coupled to display device 26 such as a liquid crystal display device installed in the front part of a driver's seat by a connector, a lead wire (not shown), or the like.

Next, an operation of input device 10 is described. Herein, resistance values of diodes 25 and 25A may vary for each equipment, which may cause a voltage drop. Firstly, a case in which the voltage drop by diodes 25 and 25A is small and negligible is described.

A user presses push button 31 indicating to increase sound volume of electronic equipment 22 such as an audio system by the thumb of the left hand in a state in which the user holds steering wheel 20. Then, switch 4 at the back side is electrically connected, and a voltage according to resistance values of resistor 23 and resistor 1 is output to drive unit 24 of electronic equipment 22 and control unit 7 of input device 10.

A case in which, for example, power supply voltage V0 is 5V and each of the resistance values of resistor 23 and resistors 1 to 3 is 1 kΩ is as follows. An output voltage of 2.5 V is output to drive unit 24 and control unit 7. This value of the output voltage is obtained by multiplying 0.5, which is a value obtained by dividing the resistance value of 1 kΩ of resistor 1 by the sum of the resistance values of 2 kΩ of resistor 23 and resistor 1, by power supply voltage V0 of 5V. Thus, drive unit 24 detects that push button 31 is pressed and controls the equipment, so that the sound volume of electronic equipment 22 is increased.

At the same time, control unit 7 detects from the output voltage of 2.5 V that push button 31 is pressed, and outputs a predetermined output signal from output terminal 9 to display device 26. A plurality of push buttons 31 to 33 and push buttons 41 to 43 are displayed on display device 26, and the pressed push button 31 among the push buttons is displayed in such a manner that black and white are reversed.

On the other hand, when push button 32 indicating to reduce sound volume is pressed, switch 5 is electrically connected. Then, an output voltage of 3.35 V is output. This value is obtained by multiplying 0.67, which is a value obtained by dividing the sum of the resistance values of 2 kΩ of resistors 1 and 2 by the sum of the resistance values of 3 kΩ of resistor 23 and resistors 1 and 2, by power supply voltage V0 of 5V. As a result, the sound volume of electronic equipment 22 is reduced, and push button 32 on display device 26 is displayed in such a manner that black and white are reversed.

Alternatively, when push button 33 showing a mode to change a supply source of music, for example, from a disk to radio is pressed, switch 6 is electrically connected. Then, an output voltage of 3.75 V is output to drive unit 24 and control unit 7. This value of the output voltage is obtained by multiplying 0.75, which is a value obtained by dividing the sum of the resistance values of 3 kΩ of resistors 1 to 3 by the sum of the resistance values of 4 kΩ of resistor 23 and resistors 1 to 3, by power supply voltage V0 of 5V.

Furthermore, when a user presses push button 41 or 42 indicating to increase or decrease a temperature of electronic equipment 22A such as an air conditioner by the thumb of the right hand, switch 4A or switch 5A at the back side is electrically connected. Then, a voltage according to resistance values of resistor 23A and resistors 1A and 2A is output to drive unit 24A and control unit 7. As a result, the temperature of electronic equipment 22A is increased or decreased, and push button 41 or 42 displayed on display device 26 is displayed in such a manner that black and white are reversed.

Furthermore, when push button 43 for changing on/off of ventilation is pressed, switch 6A is electrically connected. Then, an output voltage of 3.75 V is output to drive unit 24A and control unit 7. This value of the output voltage is obtained by multiplying 0.75, which is a value obtained by dividing the sum of the resistance values of 3 kΩ of resistors 1A to 3A by the sum of the resistance values of 4 kΩ of resistors 23A and resistors 1A to 3A, by power supply voltage V0 of 5V.

That is to say, input device 10 is mounted on steering wheel 20, and any of push buttons 31 to 33 and push buttons 41 to 43 is operated by stretching, for example, only the thumb without taking hand off steering wheel 20. Thereby, the sound volume of electronic equipment 22 or the temperature of electronic equipment 22A in a vehicle can be controlled. That is to say, a user can easily control the equipment during driving a vehicle.

Furthermore, control unit 7 previously stores output voltage values according to the operation of each switch, that is, the output voltage of 2.5 V when switch 4 is operated, the output voltage of 3.35 V when switch 5 is operated, and the output voltage of 3.75 V when switch 6 is operated. Then, control unit 7 detects which switch is operated from the output voltage when a switch is operated, and allows the operated push button among push buttons 31 to 33 and push buttons 41 to 43 to be displayed on display device 26 in such a manner that black and white are reversed. Therefore, a user can do reliable operation without error.

However, due to variation of the resistance values of diodes 25 and 25A, a voltage drop of about 0.5 V to 1 V may occur in applied voltage V1 applied to input terminal 8. In this case, an output voltage varies.

A case in which a voltage drop by diodes 25 and 25A occurs is described. For example, a case in which applied voltage V1 applied to input terminal 8 is 4.5 V by the voltage drop by diode 25 is as follows. Herein, applied voltage V1 is a voltage that is applied to input terminal 8 when all switches are turned off. The output voltage when push button 32 is pressed and switch 5 is electrically connected is 3.00 V. This value of the output voltage is obtained by multiplying 0.67, which is a value obtained by dividing the sum of the resistance values of 2 kΩ of resistors 1 and 2 by the sum of resistance values of 3 kΩ of resistor 23 and resistors 1 and 2, by applied voltage V1 of 4.5V.

On the other hand, a case in which applied voltage V1 is 4 V by diode 25 is as follows. The output voltage when push button 33 is operated and switch 6 is electrically connected is 3.00 V. This value of the output voltage is obtained by multiplying 0.75, which is a value obtained by dividing the sum of the resistance values of 3 kΩ of resistors 1, 2 and 3 by the sum of resistance values of 4 kΩ of resistor 23 and resistors 1 to 3, by applied voltage V1 of 4V. As a result, this output voltage is the same value as that when the above-mentioned switch 5 is electrically connected.

More specifically, the output voltages when pressed switches 4, 5, and 6 are vary for each equipment by a voltage drop due to variation of the resistance value of diode 25 for each equipment. Therefore, in an input device having a plurality of switches, the operated switch may not be able to be detected.

That is to say, in a conventional input device, control unit 7 previously stores output voltage values according to the operation of each switch, and detects which switch is operated based on the stored values. Therefore, in a case where an output voltage changes due to the voltage drop by variation of the resistance values of diodes 25 and 25A for each equipment when a switch is operated, the operated switch may be detected wrongly. As a result, it is difficult to obtain an input device provided with a large number of switches and capable of carrying out a variety of operations accurately.

SUMMARY OF THE INVENTION

An input device includes a resistor group, an input terminal, a plurality of switches, and a control unit. The resistor group includes a plurality of resistors connected in series. The input terminal is connected to one end of the resistor group. Each switch of the plurality of switches has one end connected to each resistor of the plurality of resistors at an opposite side viewed from the input terminal and the other end grounded. The control unit detects an applied voltage to the input terminal when the plurality of switches are all turned off. Furthermore, the control unit detects an output voltage from the input terminal when any of the plurality of switches is turned on, and detects a switch that is turned on among the plurality of switches based on a voltage ratio of the output voltage to the applied voltage.

DETAILED DESCRIPTION OF THE INVENTION

Figure 1:
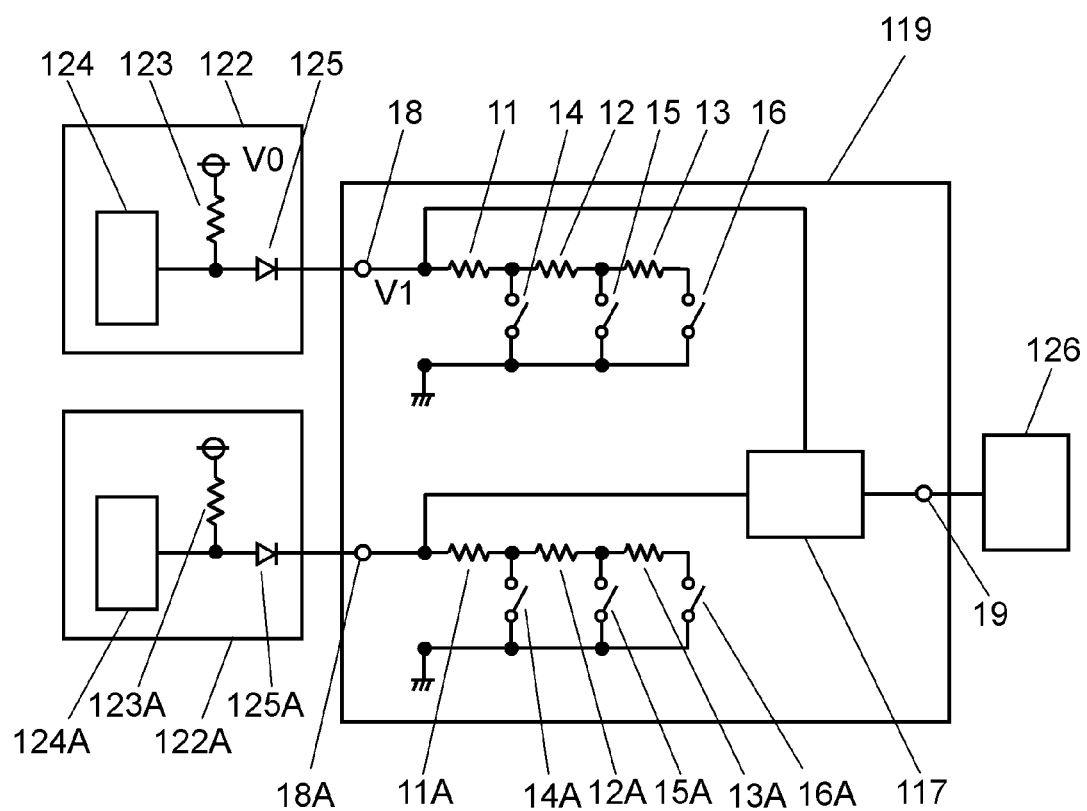
FIG. 1 is a circuit block diagram of an input device in accordance with an embodiment of the present invention.
Figure 2:
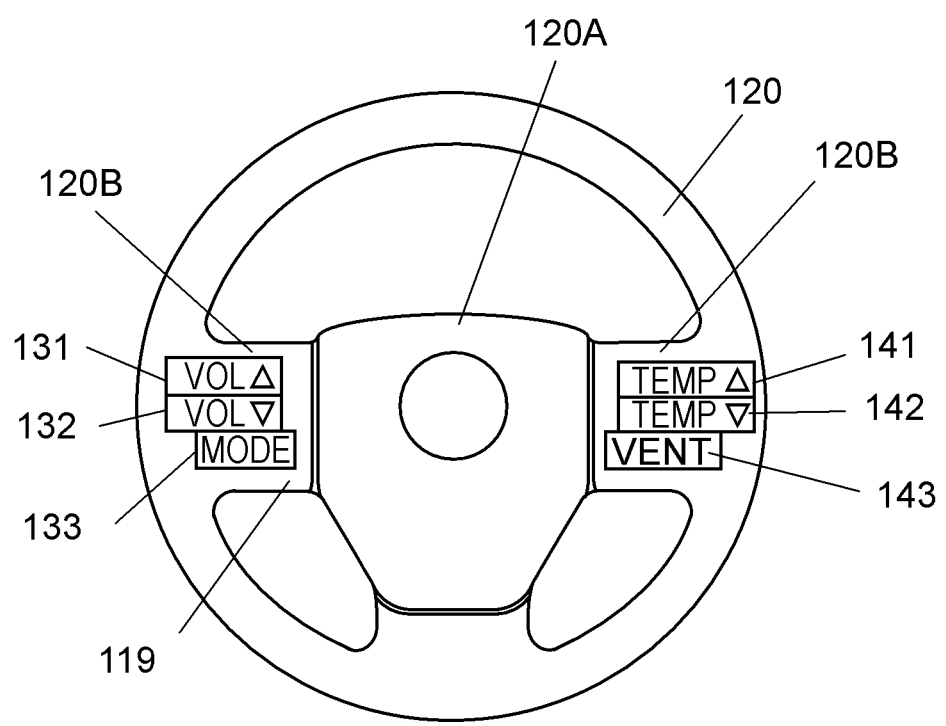
FIG. 2 is a front view of a steering wheel using the input device in accordance with the embodiment of the present invention.
Figure 3:
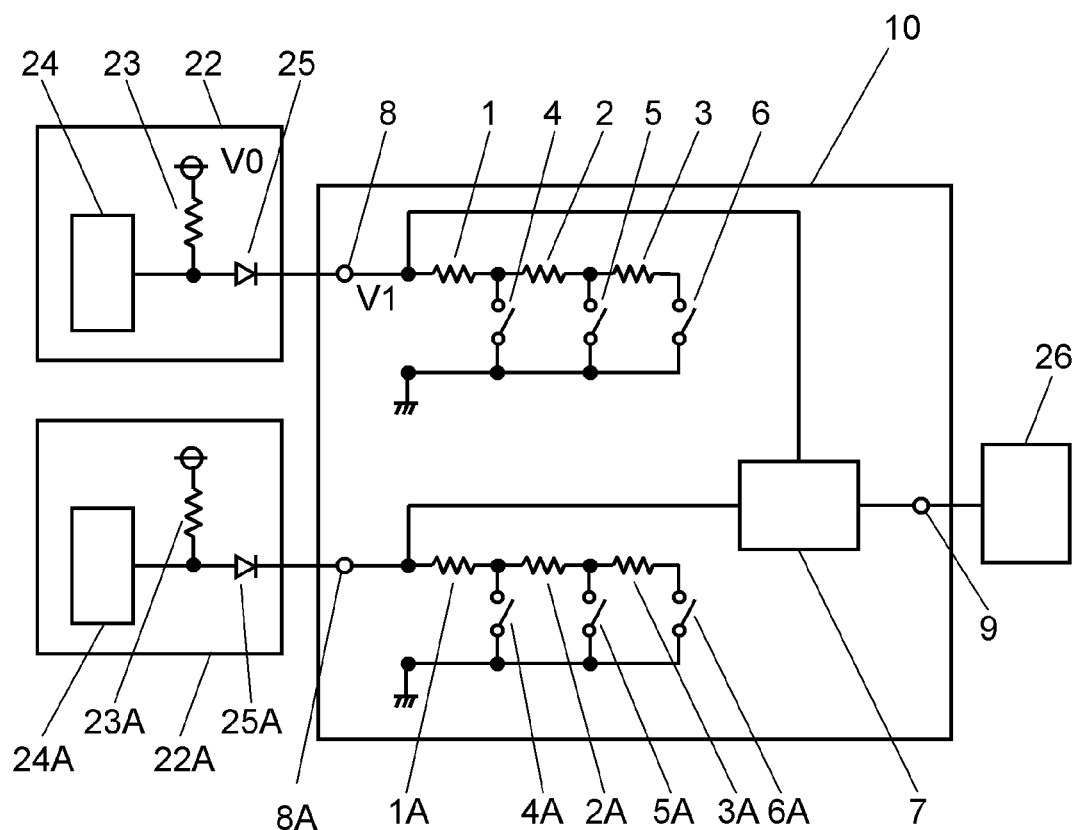
FIG. 3 is a circuit block diagram of a conventional input device.
Figure 4:
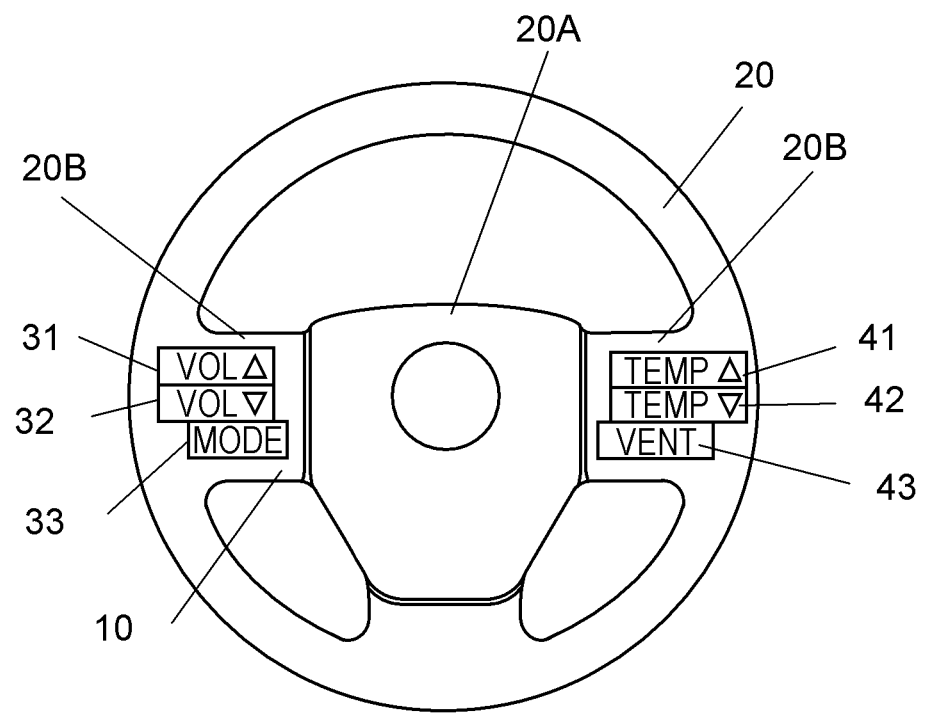
FIG. 4 is a front view of a steering wheel using the conventional input device.

FIG. 1 is a circuit block diagram of input device 119 in accordance with an embodiment of the present invention. FIG. 2 is a front view of a steering wheel using input device 119 in accordance with the embodiment of the present invention. Input device 119 includes a plurality of resistors 11 to 13 and resistors 11A to 13A, a plurality of switches 14 to 16 and switches 14A to 16A, and control unit 117.

A plurality of resistors 11, 12, and 13 such as a fixed resistor are connected in series on a wiring board (not shown) to configure a resistor group. A plurality of wiring patterns are formed on the upper and lower surfaces of the wiring board.

Furthermore, switches 14, 15, and 16 such as a push switch are mounted on the wiring board. One end of switch 14 is connected between resistor 11 and resistor 12, one end of switch 15 is connected between resistor 12 and resistor 13, and one end of switch 16 is connected to resistor 13, respectively, by the wiring pattern. The other ends of switches 14, 15, and 16 are grounded to form a resistor divider. That is to say, one end of each of switches 14, 15, and 16 is connected to each of resistors 11, 12, and 13 at the opposite side viewed from input terminal 18, and the other end of each of switches 14, 15, and 16 is grounded.

Control unit 117 such as micro computer is mounted on the wiring board. Resistor 11 and control unit 117 are connected to input terminal 18 such as a connector by the wiring pattern. Control unit 117 is connected to output terminal 19 such as a connector by the wiring pattern.

Resistors 11A, 12A, and 13A are connected in series to the other input terminal 18A provided on the wiring board to configure a resistor group. Switches 14A, 15A, and 16A such as a push switch are mounted on the wiring board. One end of switch 14A is connected between resistor 11A and resistor 12A, one end of switch 15A is connected between resistor 12A and resistor 13A, and one end of switch 16A is connected to resistor 13A, respectively, by the wiring pattern. The other ends of switches 14A, 15A, and 16A are grounded to form a resistor divider. Resistor 11A and control unit 117 are connected to input terminal 18A such as a connector by the wiring pattern.

Furthermore, control unit 117 previously stores a resistance ratio at the time when each switch is operated. A case in which, for example, each of resistance values of resistor 123 and resistors 11 to 13 is 1 kΩ is as follows. Control unit 117 stores the resistance ratio of 0.5 of switch 14, which is a value obtained by dividing the resistance value of 1 kΩ of resistor 11 by the sum of the resistance values of 2 kΩ of resistor 123 and resistor 11. Furthermore, control unit 117 stores the resistance ratio of 0.67 of switch 15, which is a value obtained by dividing the sum of the resistance values of 2 kΩ of resistors 11 and 12 by the sum of the resistance values of 3 kΩ of resistor 123 and resistors 11 and 12. Furthermore, control unit 117 stores the resistance ratio of 0.75 of switch 16, which is a value obtained by dividing the sum of the resistance values of 3 kΩ of resistors 11, 12, and 13 by the sum of the resistance values of 4 kΩ of resistor 123 and resistors 11 to 13. Input device 119 configured above is attached to right and left spokes 120B between steering wheel 120 and center pad 120A as shown in FIG. 2 and installed in an automobile. An air bag or the like is housed in pad 120A. A plurality of push buttons 131 to 133 and push buttons 141 to 143 each showing a different function are attached to switches 14, 15 and 16 and switches 14A, 15A and 16A.

Furthermore, as shown in FIG. 1, input terminal 18 of input device 119 is electrically coupled to drive unit 124 of electronic equipment 122 such as an audio system via diode 125. Diode 125 is connected in series to resistor 123. Drive unit 124 is, for example, micro computer coupled to a power supply such as a battery via resistor 123.

Furthermore, input terminal 18A is electrically coupled to drive unit 124A of electronic equipment 122A such as an air conditioner via diode 125A. Drive unit 124A is coupled to a power supply via resistor 123A. Output terminal 19 is electrically coupled to display device 126 such as a liquid crystal display device installed in the front part of a driver's seat by a connector, a lead wire (not shown), or the like.

Next, an operation of input device 119 is described. Herein, resistance values of diodes 125 and 125A may vary for each equipment, which may cause a voltage drop. Firstly, a case in which the voltage drop by diodes 125 and 125A is small and negligible is described.

Input device 119 is connected to electronic equipment 122 and 122A and display device 126 and installed in a vehicle. Then, according to a predetermined operation of a vehicle, for example, during start-up of the engine, control unit 117 detects applied voltage V1 applied to input terminal 18 when each switch is not operated and stores the detected applied voltage V1.

A user presses push button 131 indicating to increase sound volume of electronic equipment 122 such as an audio system by the thumb of the left hand in a state in which the user holds steering wheel 120. Then, switch 14 at the back side is electrically connected, and voltage according to resistance values of resistor 123 and resistor 11 is output to drive unit 124 of electronic equipment 122 and control unit 117 of input device 119.

A case in which, for example, power supply voltage V0 is 5V and each of the resistance values of resistor 123 and resistors 11 to 13 is 1 kΩ is as follows. An output voltage 2.5 V is output to drive unit 124 and control unit 117. This value of the output voltage is obtained by multiplying 0.5, which is a value obtained by dividing the resistance value of 1 kΩ of resistor 11 by the sum of the resistance values of 2 kΩ of resistors 123 and 11, by power supply voltage V0 of 5V. Thus, drive unit 124 detects that push button 131 is pressed and controls the equipment, so that the sound volume of electronic equipment 122 is increased.

At the same time, control unit 117 calculates a voltage ratio of 0.5 by dividing the output voltage of 2.5 V detected from input terminal 18 by the operation of switch 14 by applied voltage V1 detected when each switch is not operated, for example, power supply voltage V0 of 5 V. Then, control unit 117 collates the calculated voltage ratio with the previously stored resistance ratio of 0.5, detects that switch 14, that is, push button 131 is pressed, and outputs a predetermined output signal from output terminal 19 to display device 126. A plurality of push buttons 131 to 133 and push buttons 141 to 143 are displayed on display device 126, and pressed push button 131 among the push buttons is displayed in such a manner that black and white are reversed.

On the other hand, when push button 132 indicating to reduce sound volume is pressed, switch 15 is electrically connected. Then, an output voltage of 3.35 V is output. This value of the output voltage is obtained by multiplying 0.67, which is a value obtained by dividing the sum of the resistance values of 2 kΩ of resistors 11 and 12 by the sum of the resistance values of 3 kΩ of resistor 123 and resistors 11 and 12, by power supply voltage V0 of 5V.

Alternatively, when push button 133 showing a mode to change a supply source of music, for example, from a disk to radio is pressed, switch 16 is electrically connected. Then, an output voltage of 3.75 V is output to drive unit 124 and control unit 117. This value of the output voltage is obtained by multiplying 0.75, which is a value obtained by dividing the sum of the resistance values of 3 kΩ of resistors 11 to 13 by the sum of the resistance values of 4 kΩ of resistor 123 and resistors 11 to 13, by power supply voltage V0 of 5V.

Furthermore, when a user presses push button 141 or 142 indicating to increase or decrease a temperature of electronic equipment 122A such as an air conditioner by the thumb of the right hand, switch 14A or switch 15A at the back side is electrically connected. Then, a voltage according to resistance values of resistor 123A and resistors 11A and 12A is output to drive unit 124A and control unit 117.

Furthermore, when push button 143 for changing on/off of ventilation is pressed, switch 16A is electrically connected. Then, an output voltage of 3.75 V is output to drive unit 124A and control unit 117. This value of the output voltage is obtained by multiplying 0.75, which is a value obtained by dividing the sum of the resistance values of 3 kΩ of resistors of resistors 11A to 13A by the sum of the resistance values of 4 kΩ of resistors 123A and resistors 11A to 13A, by power supply voltage V0 of 5V.

That is to say, input device 119 is mounted on steering wheel 120, and any of push buttons 131 to 133 and push buttons 141 to 143 is operated by stretching, for example, only the thumb without taking hand off steering wheel 120. Thereby, the sound volume of electronic equipment 122 or the temperature of electronic equipment 122A in a vehicle can be controlled. That is to say, a user can easily control the equipment during driving a vehicle.

Furthermore, control unit 117 detects which switch is operated, and displays operated push buttons 131, 132, 133, and the like, among the plurality of push buttons 131 to 133 and push buttons 141 to 143 displayed on display device 126 in such a manner that black and white are reversed. Therefore, a user can do reliable operation without error.

At this time, control unit 117 detects applied voltage V1 to input terminals 18 and 18A when a switch is not operated, and calculates a voltage ratio by dividing the output voltage detected when each switch is operated by applied voltage V1 detected when a switch is not operated. Then, control unit 117 collates the calculated voltage ratio with the resistance ratio previously stored for each switch, and detects the operated switch. Therefore, even if a voltage drop of about 0.5 to 1 V occurs in applied voltage V1 detected by control unit 117 due to variation of the resistance values of diodes 125 and 125A for each equipment and the detected output voltage changes, the operated switch can be detected accurately without detection error.

A case in which a voltage drop by diodes 125 and 125A occurs is described below. A case in which a user presses push button 131 and switch 14 is electrically connected is as follows. When applied voltage V1 applied to input terminal 18 is 4.5 V due to the voltage drop by diode 125, an output voltage detected by control unit 117 is 2.25 V. This value is obtained by dividing the resistance value of 1 kΩ of resistor 11 by the sum of the resistance values of 2 kΩ of resistor 123 and resistor 11. Herein, applied voltage V1 is a voltage applied to input terminal 18 when all the switches are turned off.

However, for example, during start-up of the engine, control unit 117 already detects applied voltage V1 applied to input terminal 18 when each switch is not operated, and stores that this is not power supply voltage V0 of 5V but a voltage of 4.5 V after the voltage drops by diode 125. Therefore, control unit 117 calculates a voltage ratio of 0.5 by dividing the output voltage of 2.25 V at the time when push button 131 is operated by applied voltage V1 of 4.5 V at the time when the operation is not carried out.

Furthermore, control unit 117 previously stores the resistance ratio at the time when each switch is operated. For example, when switch 14 is operated, the resistance ratio of 0.5, which is a value obtained by dividing the resistance value of 1 kΩ of resistor 11 by the sum of the resistance values of 2 kΩ of resistor 123 and resistor 11, is stored. Control unit 117 collates this resistance ratio of 0.5 with the calculated voltage ratio 0.5, and detects that the operated switch is switch 14 having the resistance ratio of 0.5.

Alternatively, a case in which, for example, push button 132 is pressed and switch 15 is electrically connected and applied voltage V1 applied to input terminal 18 is 4.5 V by the voltage drop by diode 125 is as follows. An output voltage detected by control unit 117 is an output voltage of 3.00 V. This value is obtained by multiplying 0.67, which is a value obtained by dividing the sum of the resistance values of 2 kΩ of resistors 11 and 12 by the sum of the resistance values of 3 kΩ of resistor 123 and resistors 11 and 12, by applied voltage V1 of 4.5 V.

In this case, however, control unit 117 calculates the voltage ratio of 0.67 by dividing the output voltage of 3.00 V by already detected applied voltage V1 of 4.5 V at the time when the detected switch is not operated. Then, control unit 117 collates the voltage ratio of 0.67 with the previously stored resistance ratio of 0.67 of switch 5, and detects that switch 5 is operated.

A case in which applied voltage V1 is 4V by diode 125, push button 133 is operated and switch 16 is electrically connected is as follows. The output voltage is 3.00 V. This value is obtained by multiplying 0.75, which is a value obtained by dividing the sum of the resistance values of 3 kΩ of resistors 11 to 13 by the sum of the resistance values of 4 kΩ of resistor 123 and resistors 11 to 13, by applied voltage V1 of 4 V. In this case, however, control unit 117 calculates the voltage ratio of 0.75 by dividing the output voltage of 3.00 V by applied voltage V1 of 4 V detected when a switch is not operated.

Then, control unit 117 collates this resistance ratio of 0.75 with the previously stored voltage ratio of 0.75 of switch 16, and detects that switch 16 is operated. Therefore, a conventional detection error, in which it is detected that switch 15 is operated although switch 16 is operated, does not occur.

That is to say, in this embodiment, control unit 117 previously stores the resistance ratio at the time when each switch is operated, for example, the resistance ratio of 0.5 for switches 14 and 14A, the resistance ratio of 0.67 for switches 15 and 15A, and the resistance ratio of 0.75 for switches 16 and 16A. For example, during start-up of the engine, control unit 117 detects applied voltages V1, for example, 4.5V and 4V, which are applied to input terminals 18 and 18A when each switch is not operated, and which are changed by the voltage drop by diodes 125 and 125A.

Then, when each switch is operated, control unit 117 calculates a voltage ratio by firstly dividing the output voltage detected from input terminal 18 or 18A by applied voltage V1 detected when a switch is not operated. Then, control unit 117 collates the calculated voltage ratio with the previously stored resistance ratio for each switch, and detects which switch is operated. Thus, even when a voltage drop occurs due to variation of the resistance value of diodes 125 and 125A for each equipment, reliable operation can be carried out without detection error. The results are shown in Table 1. Note here that the calculation method for the resistance ratio or the output voltage is the same as a conventional calculation method.

TABLE 1

| Connected switch | Applied voltage V1 (V) | Resistance ratio | Output voltage (V) | Voltage ratio | Voltage drop |
| --- | --- | --- | --- | --- | --- |
| 131 | 5 | 0.5 | 2.5 | 0.5 | Not drop |
| 131 | 4.5 | 0.5 | 2.25 | 0.5 | Drop |
| 132 | 5 | 0.67 | 3.35 | 0.67 | Not drop |
| 132 | 4.5 | 0.67 | 3 | 0.67 | Drop |
| 133 | 5 | 0.75 | 3.75 | 0.75 | Not drop |
| 133 | 4 | 0.75 | 3 | 0.75 | Drop |

As shown in Table 1, when switch 131 is connected, even when the applied voltage is changed from 5 V to 4.5 V due to a voltage drop, the voltage ratio is 0.5. When switch 132 is connected, even when the applied voltage is changed from 5 V to 4.5 V due to a voltage drop, the voltage ratio is 0.67. Also when switch 133 is connected, even when the applied voltage is changed from 5 V to 4 V due to a voltage drop, the voltage ratio is 0.75. That is to say, when the values of the power supply voltage and the resistor are fixed, even when the applied voltage is changed, the voltage ratio is constant.

That is to say, unlike a conventional device, control unit 117 does not detect which switch is operated by storing an output voltage value according to the operation of each switch, but it previously detects applied voltage V1 at the time when a switch is not operated. Control unit 117 detects the operated switch by a voltage ratio obtained by dividing the output voltage detected when a switch is operated by applied voltage V1. Thus, even when a large number of switches are provided, detection of switch can be carried out reliably. As a result, a user can change various functions of electronic equipment 122 and 122A in a vehicle by many switches, and can carry out a variety of operations.

Note here that in the above description, for easy understanding, a configuration in which the resistance values of resistor 123 and resistors 11 to 13 are all 1 kΩ is described. However, by using resistors having different resistance values, and by setting the resistance ratio for each switch or the output voltage values output to control unit 117 at various values, each switch can be reliably detected even when a larger number of switches are provided.

According to this embodiment, control unit 117 detects applied voltage V1 applied to input terminals 18 and 18A when a switch is not operated. Then, control unit 117 detects an operated switch by the voltage ratio, which is obtained by dividing the output voltage when a switch is operated by applied voltage V1 at the time when a switch is not operated. Control unit 117 calculates the voltage ratio when the switch is operated and detects the operated switch from the voltage ratio and the previously stored resistance ratio. Therefore, it is possible to obtain an input device capable of reliable operation without detection error even when a voltage drop occurs due to variation of the resistance values of diodes 125 and 125A for each equipment.

In the above description, a configuration in which a single item of a push switch is used for switches 14 to 16 and switches 14A to 16A is described. However, the present invention can be executed if other switches are used. For example, a switch in which a fixed contact is formed of carbon and the like on the upper surface of the wiring board, and a substantially dome-shaped movable contact made of an electrically conductive metal thin plate is disposed above the fixed contact, or switch using a substantially dome-shaped flexible rubber contact having a movable contact on the lower surface thereof can be used.

In the above description, a configuration in which control unit 117 is integrated with input device 119 is described. However, control unit 117 may be provided in the electric circuit of a vehicle and input device 119 may be connected thereto.

An input device according to the present invention has an advantageous effect that the input device can execute reliable operation without detection error and is useful for operating various electronic equipment mainly in a vehicle.

What is claimed is:

1. An input device comprising:
   a resistor group including a plurality of resistors connected in series;
   an input terminal connected to a power supply via a resistor having a predetermined value and connected to one end of the resistor group;
   a plurality of switches each having one end connected to each resistor of the plurality of resistors at an opposite side viewed from the input terminal, and an other end grounded; and
   a control unit connected to the input terminal,
   wherein the control unit is configured to previously store resistance ratios of each of resistance between the input terminal and ground, to sum of the resistor with the predetermined value and the each of resistances between the input terminal and the ground when each of the plurality of switches is turned on, and
   wherein the control unit is configured to detect an applied voltage to the input terminal when the plurality of switches are all turned off, and to detect an output voltage from the input terminal when any one of the plurality of switches is turned on, and determines the switch that is turned on by collating a voltage ratio of the output voltage to the detected applied voltage with the stored resistance ratios.

2. A method for detecting a switch of an input device, the input device including:
   a resistor group including a plurality of resistors connected in series;
   an input terminal connected to a power supply via a resistor having a predetermined value and connected to one end of the resistor group;
   a plurality of switches each having one end connected to each resistor of the plurality of resistors at an opposite side viewed from the input terminal, and an other end grounded; and
   a control unit connected to the input terminal, the control unit configured to previously store resistance ratios of each of resistance between the input terminal and ground, to sum of the resistor with the predetermined value and the each of resistances between the input terminal and the ground when each of the plurality of switches is turned on, and
   the method comprising:
   detecting an applied voltage to the input terminal when the plurality of switches are all turned off;
   detecting an output voltage from the input terminal when any one of the plurality of switches is turned on; and
   determining the switch that is turned on by collating a voltage ratio of the output voltage to the detected applied voltage with the stored resistance ratios.

* * * * *